United States Patent [19]
Patel et al.

[11] Patent Number: 5,617,555
[45] Date of Patent: Apr. 1, 1997

[54] BURST RANDOM ACCESS MEMORY EMPLOYING SEQUENCED BANKS OF LOCAL TRI-STATE DRIVERS

[75] Inventors: Vipul C. Patel; Kenneth A. Poteet, both of San Jose; Chitranjan N. Reddy, Los Altos Hills, all of Calif.

[73] Assignee: Alliance Semiconductor Corporation, San Jose, Calif.

[21] Appl. No.: 565,383

[22] Filed: Nov. 30, 1995

[51] Int. Cl.$^6$ ................................................. G06F 13/00
[52] U.S. Cl. .................. 395/432; 395/427; 395/431; 365/230.03; 365/230.06; 365/230.08
[58] Field of Search ........................... 395/427, 431, 395/432; 365/230.03, 230.06, 230.08

[56] References Cited

U.S. PATENT DOCUMENTS

| | | | |
|---|---|---|---|
| 5,268,865 | 12/1993 | Takasugi | 365/189.05 |
| 5,289,584 | 2/1994 | Thome et al. | 395/325 |
| 5,390,149 | 2/1995 | Vogley et al. | 365/189.01 |
| 5,392,239 | 2/1995 | Margulis et al. | 365/189.01 |
| 5,440,523 | 8/1995 | Joffe | 365/230.05 |
| 5,442,588 | 8/1995 | Runas | 365/222 |
| 5,506,810 | 4/1996 | Runas | 365/230.03 |
| 5,526,320 | 6/1996 | Zagar et al. | 365/233.5 |

*Primary Examiner*—Tod R. Swann
*Assistant Examiner*—Frank J. Asta
*Attorney, Agent, or Firm*—Bradley T. Sako

[57] ABSTRACT

A burst dynamic random access memory (DRAM) (10) is disclosed having memory cells arranged in a number of quadrants (22), each quadrant including local I/O lines (24) for accessing the memory cells therein. The local I/O lines (24) of each quadrant are commonly coupled to global I/O lines (26) by tri-state driver banks (30). According to a row address and a first portion of a column address, a row decoding circuit (36) and column decoding circuit (40) couple one set of local I/O lines (24) within each quadrant (22) to selected columns within the quadrants (22). A bank sequencer (48) receives a second portion of the column address and generates burst sequence of different bank select signals. Each bank select signal enables a different set of tri-state driver banks (30). The enabled tri-state driver banks (30) provide a data path between the local I/O lines (24) and the global I/O lines. By enabling a different combination of tri-state driver banks (30) for each bank select signal, burst access is provided to the burst DRAM (10).

20 Claims, 5 Drawing Sheets

BURST RANDOM ACCESS MEMORY EMPLOYING SEQUENCED BANKS OF LOCAL TRI-STATE DRIVERS

TECHNICAL FIELD

The present invention relates generally to random access memories (RAMs) and more particularly to asynchronous "burst" mode dynamic RAMs (burst DRAMs).

BACKGROUND OF THE INVENTION

An increasingly critical limitation on computer systems is the rate at which data is transferred between a microprocessor and its associated random access memory (RAM), often referred to as the "memory bandwidth" of the system. While in the past, standard, asynchronous dynamic RAMs (DRAMs) were fast enough to provide enough bandwidth for most applications, presently, the clock speeds of microprocessors far outpaces the access times of conventional DRAMs. The need for increased memory bandwidth has led to a variety of approaches to memory designs. Fast "cache" RAMs are used in conjunction with the microprocessor to increase certain memory accesses. The high speed of cache memories requires the use of static RAMs (SRAMs). While suitable for cache applications, SRAMs are too expensive to make up the bulk of a system RAM. Where feasible, particularly for the storage of video display data, multi-port DRAMs (sometimes referred to as VRAMs for video RAMs) are used. Multi-port DRAMs are complex devices, and so, like SRAMs, are too costly to implement as basic system RAM.

Another approach to increasing memory bandwidth is the use of burst synchronous DRAMs. Burst synchronous DRAMs are timed according to a system clock and include a "burst mode" wherein multiple, synchronous, memory accesses are provided in response to a single burst memory address. A burst synchronous RAM is disclosed in U.S. Pat. No. 5,268,865 entitled SYNCHRONOUS BURST-ACCESS MEMORY and issued to Atsushi Takasugi on Dec. 7, 1993. In the burst RAM of Takasugi, a counting means counts clock pulses and generates a series of column addresses. The column addresses are coupled to a column decoding means which selects one column at a time. Decoded data are transferred via a data transfer means to an internal data bus having as many data (local I/O) lines as there are bit lines per column. The data are then provided via (global) I/O lines. A drawback to Takasugi is that if precharging is used to increase access speed, such a precharge step must occur between each cycle of the burst sequence on both the local and the global I/O lines.

Another synchronous DRAM is disclosed in U.S. Pat. No. 5,390,149 entitled SYSTEM INCLUDING A DATA PROCESSOR, A SYNCHRONOUS DRAM, A PERIPHERAL DEVICE, AND A SYSTEM CLOCK, issued to Vogley et al. on Feb. 14, 1995. Vogley et al. teaches a synchronous DRAM having an input multiplexer (MUX) and an output MUX controlled by a burst count. In a read operation, multiple blocks of data are read into an output register. The output register is coupled to an output selector gate which outputs sequential bits of the output register according to the synchronous, burst sequence. Similarly, in a write operation, data are sequentially input through an input selector gate and latched in an input register. The data are then transferred by blocks to the array. A drawback to the Vogley et al. synchronous burst DRAM is the large size of the buses used to transfer data from the array to the input and output MUXs. Such buses, often referred to as "global" input/output (I/O) lines can consume large amounts of die area. Further, every even cycle is more time consuming than the second, and subsequent cycles, as the sense amplifiers must drive the large global I/O lines to latch data in the input or output MUXs.

A drawback of all burst synchronous DRAMs is that they require a synchronous system design. Because most current computer RAM architectures are designed for asynchronous DRAMs, burst synchronous DRAMs remain incompatible with many existing computer systems. To make such systems compatible with synchronous DRAMs would typically require, at a minimum, a new DRAM controller, introducing additional cost to the system.

An alternative to burst synchronous DRAMs is the use of burst asynchronous DRAMs (referred to herein simply as "burst DRAMs"). Burst DRAMs are more easily implemented in present computer systems as they are compatible with the majority of current system RAM architectures. Burst DRAMs can provide rapid access times, particularly when combined with such options as "extended data-out" (EDO). Commonly, a burst operation in a burst DRAMs involves an initial address being accessed by a row and column address, using conventional row address strobe ($\overline{RAS}$) and column address strobe ($\overline{CAS}$) timing. Subsequent accesses of the burst sequence are initiated by subsequent application(s) of the $\overline{CAS}$ signal(s).

It is known in the prior art to provide a burst DRAM with an array divided into a number of subarrays, each having a number of local I/O lines. In order to ensure proper sequential operation, data on the local I/O lines are latched by local I/O latches situated proximate their respective subarrays. A drawback of this approach is that the use of such latches can consume valuable die space, increasing the overall size of the device. In addition, prior art burst DRAMs suffer from the same drawbacks as synchronous DRAMs, requiring a precharge operation between burst cycles or large amounts of die area for global I/O lines.

It would be desirable to provide a burst DRAM that eliminates the above mentioned drawbacks of the prior art.

SUMMARY OF THE INVENTION

It is an object of the present invention to provide a burst DRAM that does not require a precharge operation on the local I/O lines between counts in the burst sequence.

It is another object of the present invention to provide a burst DRAM having no "local" I/O latches.

It is yet another object of the present invention to provide a burst DRAM having a compact architecture.

According to the present invention a burst DRAM includes memory cells arranged into a number of quadrants. The memory cells in a given quadrant are accessed by a plurality of local I/O lines. The local I/O lines of each quadrant are commonly coupled to global I/O lines by banks of tri-state drivers. Latching is performed at the global level, with each global I/O line terminating in a global I/O latch. The burst DRAM receives a row address and the upper portion of a column address, and in response, places data on a selected set of local I/O lines in each quadrant. Sufficient data are placed on the local I/O lines in response to this one address, for an entire burst sequence. A counter circuit receives the lower portion of the column address, and according to a count signal, generates burst sequence of count-bits. Each different combination of count bits enables a different set of tri-state driver banks. The enabled tri-state driver banks provide a data path between the selected local I/O lines of their respective quadrant, and the global I/O lines. By enabling a different combination of tri-state driver banks for each sequential count-bit combination, burst access is provided to the burst DRAM. Driving the global I/O lines with tri-state drivers provides for fast read operations during all cycles of the burst sequence.

An advantage of the present invention is that it provides a burst DRAM that does not require a precharge operation on the local I/O lines between burst cycles, and further, does not introduce additional delay to the first cycle of a burst read operation.

Yet another advantage of the present invention is that it provides a burst DRAM that does not require a precharge operation on the local I/O lines between burst cycles, and further, does not have a large number of global I/O lines, resulting in decreased die size.

Other objects and advantages of the invention will become apparent in light of the following description thereof.

DETAILED DESCRIPTION OF THE EMBODIMENTS

Figure 1:
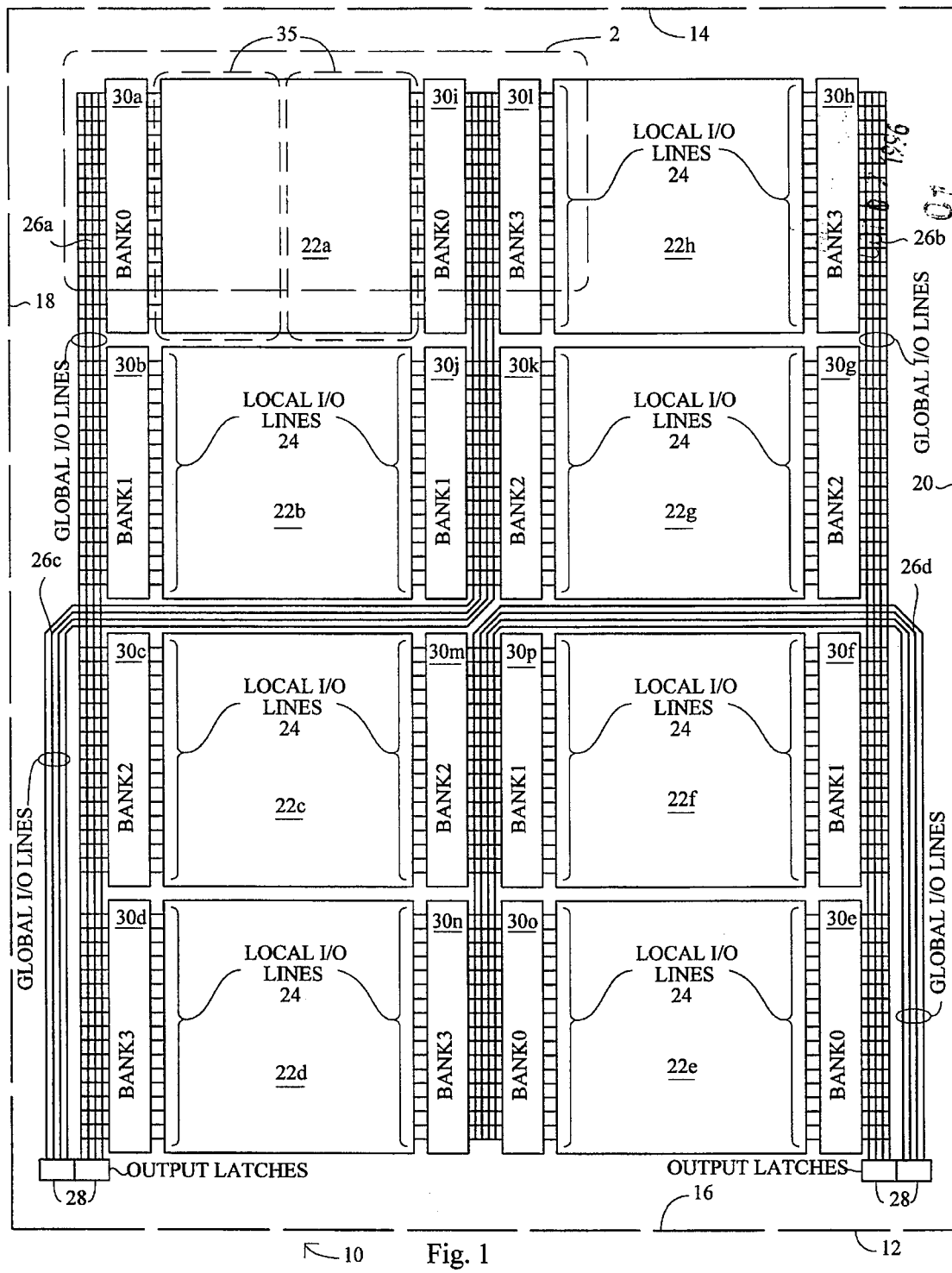
FIG. 1 is a top plan view block diagram illustrating a burst dynamic random access memory according to a preferred embodiment of the present invention.

The burst DRAM of a preferred embodiment of the present invention is organized as a "by sixteen" memory, and provides a burst sequence of four. Referring now to FIG. 1, a burst dynamic random access memory (DRAM) according to a preferred embodiment is set forth generally, and designated by the reference character 10. The burst DRAM 10 is fabricated as a single monolithic integrated circuit (die). The die is represented by a dashed line 12 and includes a first end 14, a second end 16, a first side 18, and a second side 20.

The burst DRAM 10 includes a number of memory quadrants 22a–h, each having local I/O lines 24 for accessing memory cells therein. In a read operation, data are placed on selected local I/O lines 24 and then transferred to a number of global I/O lines 26. In a write operation, data are placed on the global I/O lines 26 and then transferred to selected local I/O lines 24. It is understood that the term "quadrant" is not meant to imply each quadrant includes one-fourth of the total memory cells. As shown in FIG. 1, the preferred embodiment includes eight "quadrants."

The preferred embodiment also includes a row address buffer, column address buffer, input data buffers, output data buffers, and an internal timing and control circuit (all not shown). These circuits are conventional in nature and so will not be discussed in further detail herein.

Unlike burst DRAMs of the prior art, the preferred embodiment of the present invention does not include latches coupled to the local I/O lines 24. Instead, a number of global latches 28 are coupled to the global I/O lines 26. This reduces the overall number of latches required for a burst operation. The global I/O latches 28 are remotely situated with respect to the majority of local I/O lines 24, and to ensure that the global I/O lines 26 are driven fast enough by data on the local I/O lines 24, tri-state driver banks 30 are provided to couple the local I/O lines 24 to the global I/O lines 26. While the preferred embodiment illustrates the global I/O latches 28 situated proximate the second end 16 of the die, this should not be construed as limiting. The global I/O latches 28 positioning follows the location of the I/O data buffers, which is generally dictated by the pin-out of the device.

The tri-state driver banks 30 serve a further function of generating a burst sequence without the need to precharge the local I/O lines 24. Data for an entire burst sequence are placed on local I/O lines 24 according to a portion of a column address. During each cycle of the burst sequence, a different combination of tri-state driver banks 30 is enabled, providing a burst sequential access to the quadrants 22. The elimination of local I/O line precharging reduces access time. The resulting extra time enables the use of the global I/O latches 28, as more time is allowed to get data from the quadrants 22 and onto the global I/O lines 26. The burst operation of the present invention will be discussed in more detail at a later point herein.

The global I/O lines 26 of the preferred embodiment are separated into four sets (shown as 26a–d). A first set of global I/O line 26a extends in a longitudinal direction, adjacent to memory quadrants 22a–d, and proximate the first side 18 of the die 12. Four tri-state driver banks 30a–d couple the local I/O lines 24 of quadrants 22a–d to the first set of global I/O lines 26a. Similarly, a second set of global I/O lines 26b extends in a longitudinal direction proximate the second side 20 of the die 12, and is coupled to the local I/O lines 24 of quadrants 22e–h by tri-state driver banks 30e–h. According to a decoding scheme described later, only one of the tri-state driver banks 30a–d is enabled at any one time. The same holds true for tri-state driver banks 30e–h.

A third set of global I/O lines 26c extends in the longitudinal direction between quadrants 22a and 22h, and between quadrants 22b and 22g. The third set 26c then continues in a lateral direction between quadrants 22b and 22c, runs adjacent to the first set 26a, and terminates in I/O latches 28 at the second end 16 of the die 12. The third set of global I/O lines 26c is coupled to quadrants 22a–b and 22g–h by tri-state driver banks 30i–l. It is noted that tri-state driver banks 30i and 30l oppose one another, and couple their respective local I/O lines 24 to the same set of global I/O lines 26c. In a similar fashion, opposing tri-state drivers 30j and 30k commonly couple their respective local I/O lines 24 to the same set of global I/O lines 26c. Like the previously described tri-state driver banks, only one of the tri-state driver banks 30i–l is enabled at any one time.

A fourth set of global I/O lines 26d is arranged in a similar fashion to the third set 26c. The local I/O lines 24 of quadrants 22c–f are coupled, via tri-state driver banks 30m–p, to the fourth set of global I/O lines 26d. Opposing tri-state driver bank pairs 30m/30p, and 30n/30o, are coupled to the same set of global I/O lines 26d. The fourth set 26d extends in the longitudinal direction between the quadrants 22c–f, runs laterally between quadrants 22f and 22g, and then continues adjacent to the second set of global I/O lines 26b toward the second end of the die 16. The fourth set 26d terminates in global latches 28. As in the case of tri-state driver banks 30i–l, only one of the four tri-state driver bank 30m–p is enabled at any one time.

Figure 2:
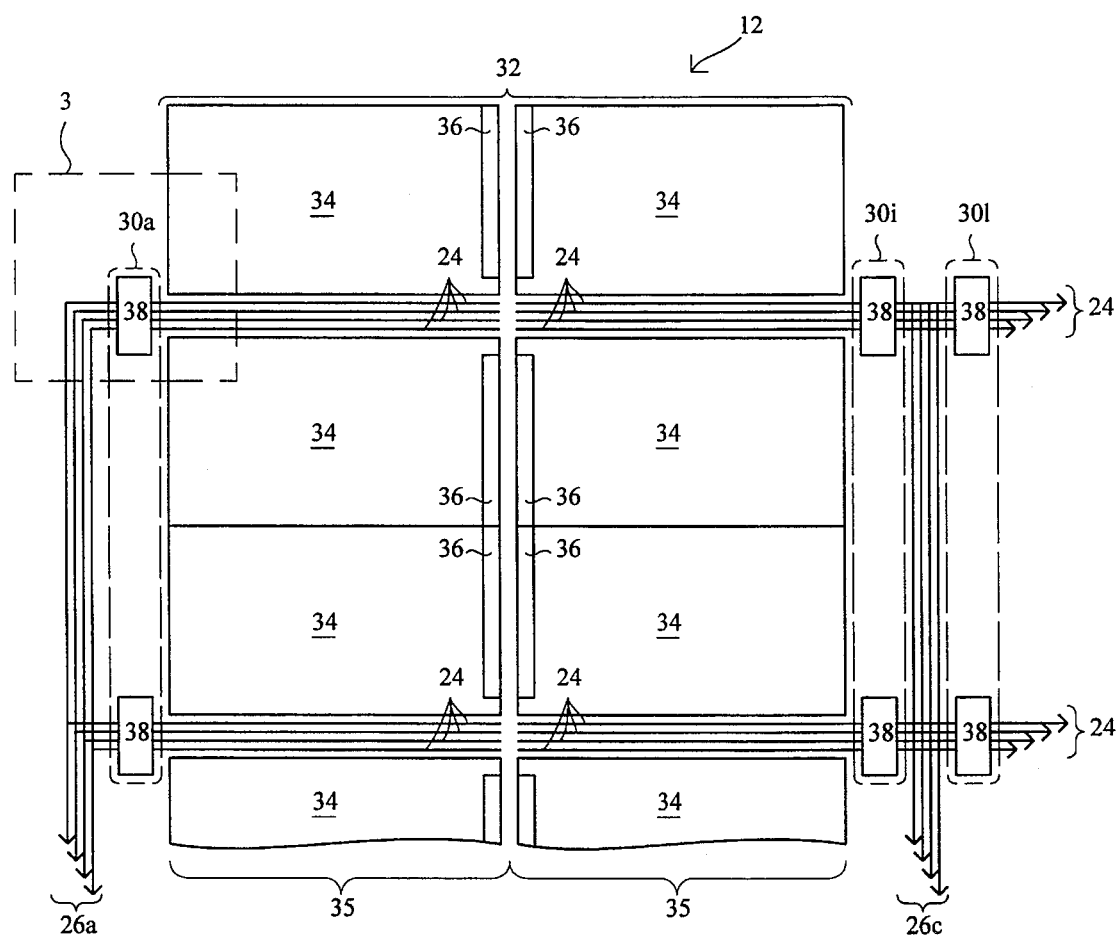
FIG. 2 is a top plan view block diagram illustrating a corearray and peripheral circuits according to a preferred embodiment.

A portion of FIG. 1, designated by the general reference character 2, is set forth in more detail in FIG. 2.

Referring now to FIG. 2, it is shown that each memory quadrant 22 of a preferred embodiment is composed of a plurality of memory corearrays 32, each including four memory arrays 34. The arrays 34, as is well understood in the art, include memory cells accessed by rows and columns. Each array 34 is coupled to two local I/O lines 24, for a total of eight local I/O lines 24 in each corearray 32. Four of the eight local I/O lines 24 extend to tri-state driver bank 30a, and the remaining four local I/O lines 24 extend in the opposite direction to tri-state driver bank 30i. Each quadrant 22 can be conceptualized as consisting of two, half-quadrants, each including a number of arrays 34, with each half-quadrant providing a set of four local I/O lines 24 to a given tri-state driver bank 30. The two half-quadrants of quadrant 22a are shown in FIGS. 1 and 2, and designated by the reference character 35.

Referring back to FIG. 2, each array 34 is further shown to include a row decoding circuit 36. As is well understood in the art, the row decoding circuits 36 are responsive to internal row decode signals generated from an externally applied row address, and select a particular row in response thereto. The particular number of arrays 34 comprising a corearray 32 should not be read as limiting. The present invention could be implemented with "corearrays" consisting of a single memory cell array.

As set forth in FIG. 2, the global I/O line sets 26a and 26c include four global I/O lines. The simultaneous driving of the four sets of four global I/O lines generates the "by sixteen" output of the preferred embodiment. Further, the tri-state driver banks 30 are composed of a number of commonly enabled tri-state driver groups 38, one group for every four local I/O lines 24. The tri-state driver groups 38 each couple their four respective local I/O lines 24 to one of the global I/O line sets (26a or 26c). It is noted that there are no data latches coupled to the local I/O lines 24.

Figure 3:
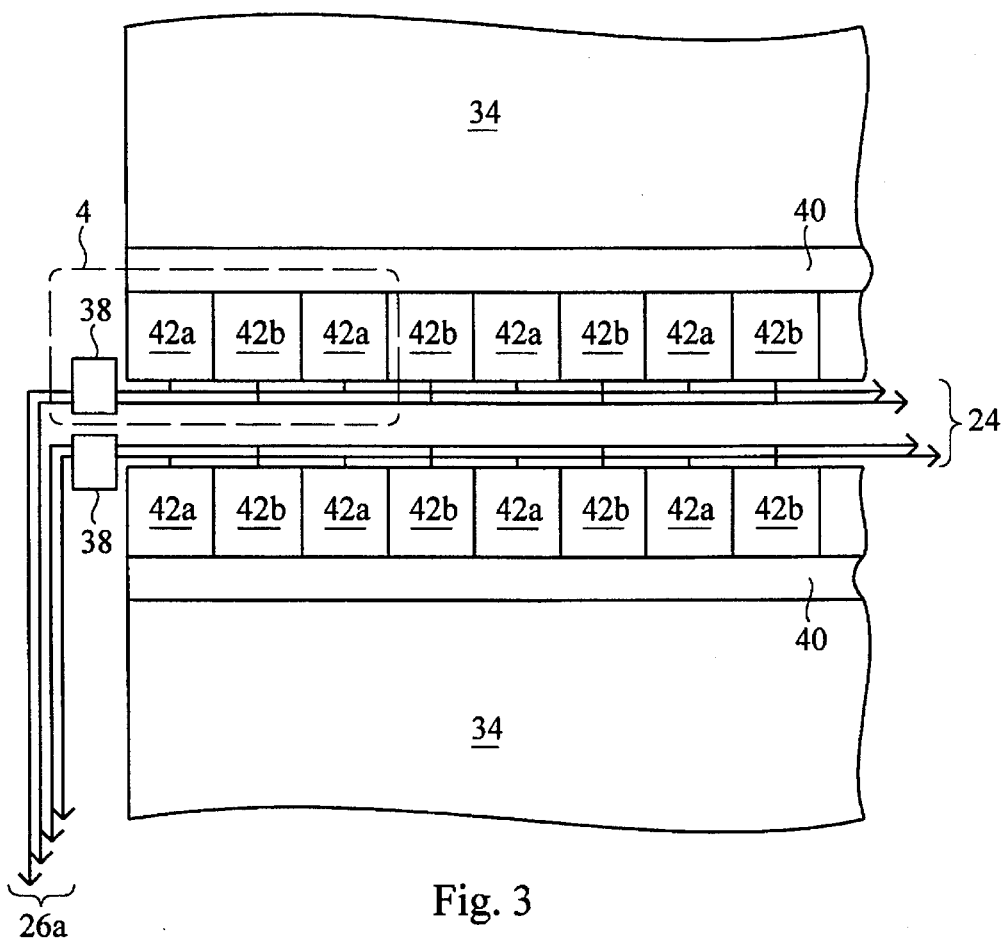
FIG. 3 is top plan view block diagram illustrating a portion of a corearray according to a preferred embodiment.

Referring now to FIG. 3, a portion of FIG. 2, designated by the reference character 3, is set forth in more detail. As shown in FIG. 3, each array 34 includes a column decoder circuit 40 and a row of sense amplifiers 42. The sense amplifiers 42 of each array 34 can be conceptualized as being logically divided into groups, with each group being commonly coupled to a particular local I/O line 24. In the preferred embodiment, there are two local I/O lines 24 associated with each array 34, with each even numbered sense amplifier 42a being coupled to one local I/O line 24, and each odd numbered sense amplifier 42b being coupled to the other local I/O line 24.

Figure 4:
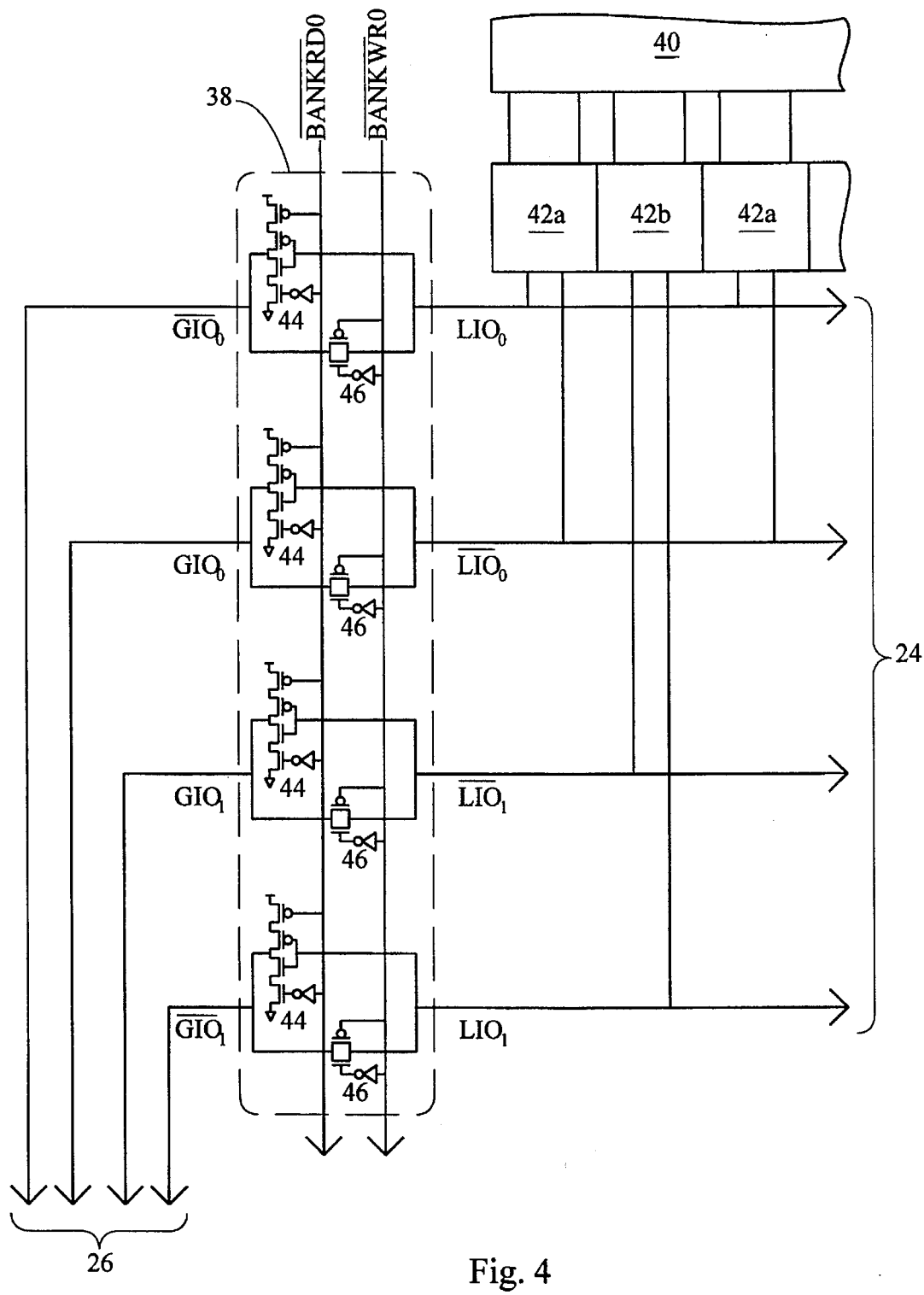
FIG. 4 is a block diagram illustrating a portion of a tri-state driver bank according to a preferred embodiment.

To better illustrate the preferred embodiment, a portion of FIG. 3, designated by the reference character 4, is shown in a block schematic diagram in FIG. 4.

Referring now to FIG. 4, a portion of a tri-state driver group 38, three sense amplifiers 42, two local I/O lines 24, and two global I/O lines 26 are illustrated. In the preferred embodiment, each sense amplifier 42 provides both an inverted and a non-inverted output signal. As a result, each local I/O line 24 is actually a local I/O line pair (shown as $LIO_0/\overline{LIO_0}$ and $LIO_1/\overline{LIO_1}$). In a like manner, the global I/O lines 26 are each a global I/O line pair ($GIO_0/\overline{GIO_0}$ and $GIO_1/\overline{GIO_1}$).

Each local I/O line 24 is coupled to its respective global I/O line 26 by a tri-state driver 44/passgate 46 pair. The tri-state drivers 44 enable a read path from the sense amplifiers 42 to the global latches (not shown) by driving the global I/O lines 26 according to the data on the local I/O lines 24. The passgates 46 enable a write path to the sense amplifiers 42 by allowing data on the global I/O lines 26 to drive the data on the local I/O lines 24. The tri-state drivers 44 are shown to be commonly enabled by a "bank read" signal (shown as $\overline{BANKRD}$ n, with n being equal to 0 in FIG. 4). It is understood that in the preferred embodiment all the tri-state drivers 44 in a single tri-state driver bank 30 are commonly enabled by the same $\overline{BANKRD}$ n signal. In a similar manner, the passgates 46 are commonly enabled by a "bank write" signal (shown as $\overline{BANKWR}$ n, with n being equal in zero). The derivation of both the $\overline{BANKRD}$ n and $\overline{BANKWR}$ n is illustrated in FIG. 5.

Figure 5:
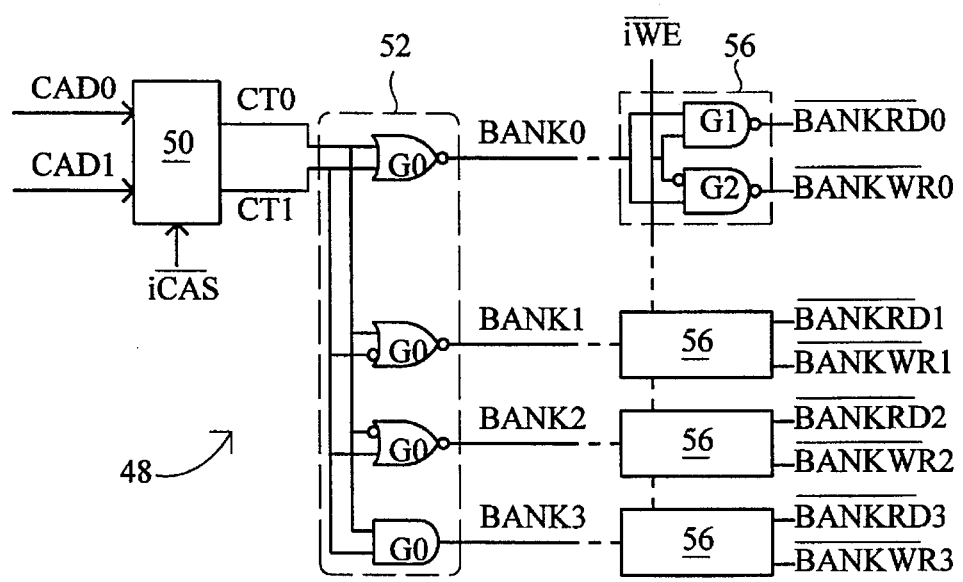
FIG. 5 is a block schematic diagram illustrating the tri-state bank sequencer according to a preferred embodiment.

Referring now to FIG. 5, a block schematic diagram is set forth illustrating a tri-state bank sequencer 48 according to a preferred embodiment. The bank sequencer 48 includes a counter circuit 50 that receives the two least significant bits of a column address (shown as CAD0 and CAD1). It is understood that CAD0 and CAD1 inputs are derived from an externally applied column address. Address buffering in burst DRAMs is well understood in the art and so will not be discussed in further detail. The counter circuit 50 is responsive to an internal column address strobe signal (shown as $i\overline{CAS}$). As is common in burst DRAMs, the externally applied control signal $\overline{CAS}$, is used to initiate each cycle of a burst sequence. The $i\overline{CAS}$ signal is a buffered form of the external $\overline{CAS}$ signal. According to well understood principles, the counter circuit 50 provides a two-bit count output (shown as CT0 and CT1), that starts with an initial value based upon the values of CAD0 and CAD1 at an initial $i\overline{CAS}$ strobe. A different CT1/CT0 combination then follows each subsequently applied $i\overline{CAS}$ strobe until the burst sequence is over, interrupted, or suspended. In the preferred embodiment, the counter circuit 50 is programmable, allowing for two modes of operation, each having a different type of four cycle burst sequence.

As shown in FIG. 5, the two-bit count output (CT1, CT0) of the counter circuit 50 is provided as an input to a number of bank decoders 52. The number of bank decoders 52 is equal to the number of counts in the burst sequence (four, in the preferred embodiment). Each bank decoder 54 includes logic (shown as gates G0) that generates a high bank select signal, according to a particular count bit combination. In FIG. 5, four bank select signals are generated (BANK0–BANK3) corresponding to the four possible two-bit count outputs (i.e., 00, 01, 10, and 11). The bank select signals are each received by a write enable section 56 of the tri-state bank sequencer 48. In the preferred embodiment, the counter circuit 50 and the bank decoders 54 are situated remotely from the write enable sections 56, with long interconnects carrying the bank select signals thereto. The long interconnects are represented by the dashed portion of the BANK0–BANK3 lines.

The write enable sections 56 generate the $\overline{BANKRD}$ n and $\overline{BANKWR}$ n signals in response to their respective bank select signal BANKn and an internal write enable signal $i\overline{WE}$. The signal $i\overline{WE}$ is derived from an externally applied $\overline{WE}$ signal. Because the write enable sections 56 of the preferred embodiment are identical, only the write enable section 56 for BANK0 is set forth in detail. When $i\overline{WE}$ is active (low) and BANK0 is selected (BANK0 is high), $\overline{BANKWR0}$ will be active (low). Conversely, if $i\overline{WE}$ is high and BANK0 is high, $\overline{BANKRD0}$ will be active (low).

Accordingly, write paths and read paths are enabled through the tri-state driver banks 30.

Referring back to FIG. 1, the various tri-state driver banks 30 are identified according to their corresponding bank decoders 52. Tri-state driver banks 30a, 30i, 30o, 30e correspond to BANK0, and are identified as so in the figure. Similarly, tri-state driver banks 30b, 30j, 30f, 30p are BANK1; 30c, 30m, 30g, 30k are BANK2, and 30d, 30n, 30h, 30l are BANK3. Referring now to FIG. 1 in conjunction with FIGS. 6a–6d, the operation of a preferred embodiment is set forth. Each of FIGS. 6a–6d is an identical top plan-view block diagram setting forth the quadrants 22, tri-state driver banks 30, and global latches 28 of the burst DRAM 10. Further, each of FIGS. 6a–6d, illustrates a different cycle in the four count burst sequence.

At the start of the burst sequence, a row address and the upper portion of a column address are used to select a word lines and couple columns to selected sense amplifiers. As a result, the local I/O lines of one corearray 32 within each quadrant 22 are coupled to a particular set of memory cells. The coupled local I/O lines are identified by the reference number 58 in FIGS. 6a–6d.

For the burst sequence of FIGS. 6a–6d it is assumed that the last two bits of an initial column address are "00" and the counter circuit 50 generates a "linear" burst sequence, where CT1 and CT0 are "00, 01, 10 and 11." This sequence will select the banks in numerical order. Of course, this count sequence and length should not be construed as limiting the present invention thereto.

Figure 6A:
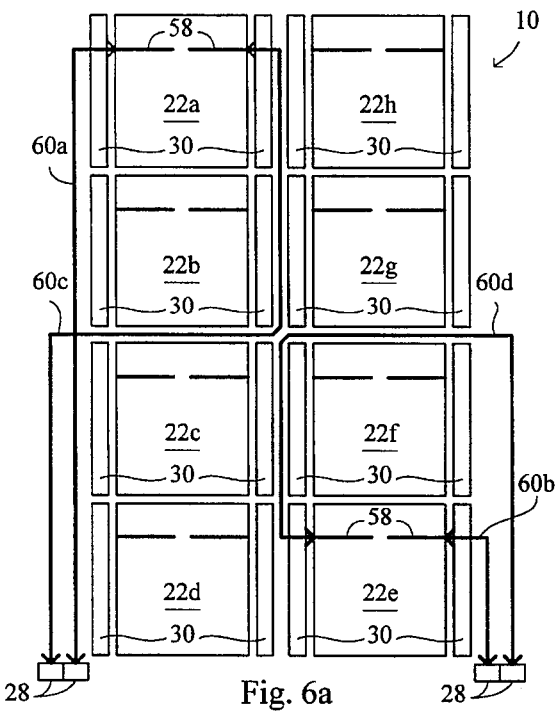
FIG. 6a–6d are top plan view block diagrams illustrating the operation of a preferred embodiment during a burst sequence.

Referring now to FIG. 6a, in the first cycle of the burst sequence, CT1 and CT0 are "00". As will be recalled, this count bit combination generates the BANK0 signal which enables those tri-state driver banks 30 identified as BANK0 in FIG. 1. This results in four, four-bit data paths (shown as 60a–d in FIG. 6) from the active quadrants (22a and 22e), through the enabled tri-state driver banks 30 to the global I/O latches 28 via the global I/O lines 26. In the event a read operation is taking place, as mentioned previously, tri-state drivers 44 drive the global I/O lines 26 according to data on the local I/O lines 24. In a write operation, passgates 46 enable data on the global I/O lines 26 to be transferred to the coupled local I/O lines 58.

Figure 6C:
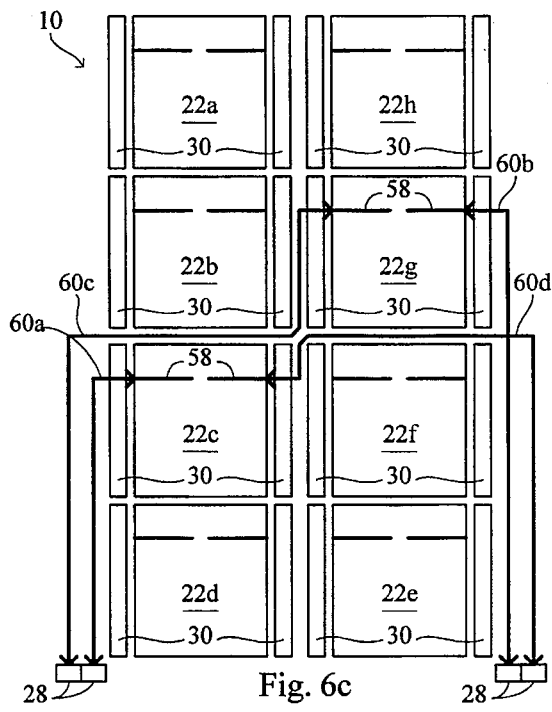
Figure 6B:
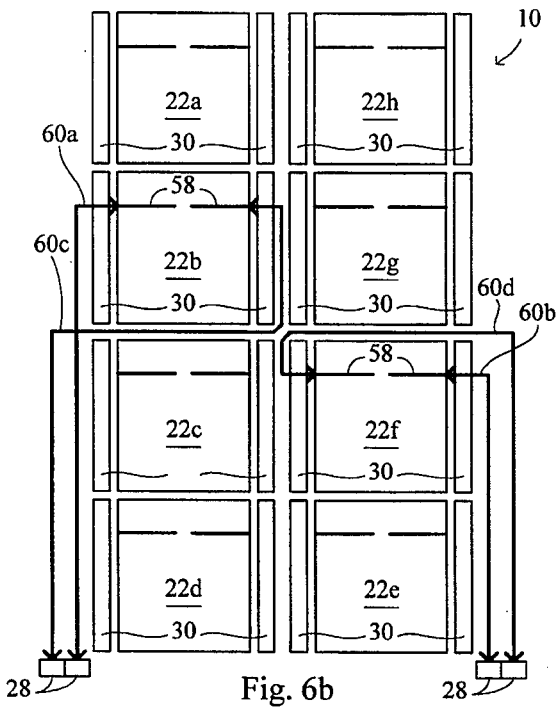

FIG. 6b illustrates the second cycle of the burst sequence. The counter circuit generates a second two-bit sequence, and CT1/CT0 are now "01." In response, the BANK1 tri-state driver banks 30 are enabled, and four, different, four-bit data paths (60a–d) are provided between the global I/O latches 28 and the active quadrants 22b and 22f.

Figure 6D:
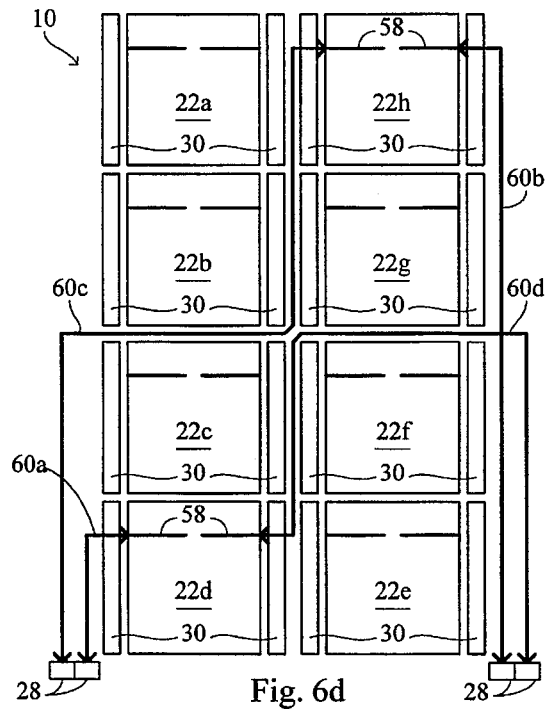

FIGS. 6c and 6d illustrate the final two cycles of the burst sequence. During each cycle, two different sets quadrants are active (i.e., the tri-state driver banks 30 associated with the quadrants 12 are enabled). In the third cycle (FIG. 6c) it is quadrants 22c and 22g. In the fourth, and last cycle (FIG. 6d) it is quadrants 22d and 22h.

Referring back to FIG. 1, it is recalled that each quadrant 22 can be conceptualized as two half-quadrants. The half-quadrants can be further organized into half-quadrant I/O groups that share a common set of global I/O lines. Quadrants 22a–d each include a half-quadrant of a first I/O group that shares the first set of global I/O lines 26a. Similarly, quadrants 22e–h each include half-quadrants of a second I/O group that share the second set of global I/O lines 26b. A third I/O group includes half-quadrant from quadrants 22a–b and 22h–g, commonly coupled to the third set of global I/O lines 26c. A last I/O group includes half-quadrants from quadrants 22c–d and 22e–f, commonly coupled to the fourth set of global I/O lines 26d. If conceptualized in such a manner, there are as many half-quadrants in an I/O group as there are cycles in a burst sequence, with only one half-quadrant in each I/O group being coupled to its common global I/O line set during each cycle.

It is noted that no local I/O line precharge or equalization step for the local I/O lines is needed between burst count cycles. Further, the count address of the burst count does not need to pass through one or more column decoding sections. Instead, the burst count is directed to the bank decoders 52, which can be situated in close proximity to their respective tri-state driver banks 30.

The number of global I/O lines 26 in the present invention remains minimal, conserving valuable die area between the quadrants. In addition, by driving the I/O lines with tri-state drivers during read operations, no delay is introduced by forcing the sense amplifiers to drive global I/O lines.

The use of global I/O latches as set forth in the present invention, as opposed to local latches associated with each local I/O lines, reduces the overall size of burst DRAM, and frees up valuable die space proximate the arrays.

The present invention is not limited to DRAMs. One skilled in the art could implement the invention in other RAM types, including, but not limited to, static RAMs, ROMs and EPROMs.

As will be apparent to one skilled in the art, the invention has been described in connection with its preferred embodiments, and may be changed, and other embodiments derived, without departing from the spirit and scope of the invention. Accordingly, the above disclosure is not intended to be limiting and the appended claims are to be interpreted as encompassing the entire scope of the invention.

What we claim is:

1. A burst random access memory (RAM), comprising:

a plurality of memory quadrants, each quadrant including a plurality of memory corearrays, each corearray including a plurality of columns, a plurality of local input/output (I/O) lines, and a plurality of sense amplifiers logically divided into I/O groups, each I/O group being commonly coupled to at least one of the local I/O lines;

an address decoder circuit for receiving a first portion of an address, and in response thereto, coupling selected columns in the quadrant to one sense amplifier within each I/O group;

a plurality of global I/O lines;

a tri-state driver bank associated with each memory quadrant, each said tri-state driver bank coupling the local I/O lines of its associated quadrant to a group of global I/O lines, each said tri-state driver bank being activated by a particular bank select signal;

a tri-state bank sequencer for providing a sequence of bank select signals, said tri-state bank sequencer generating an initial bank select signal in response to a second portion of the column address and an external control signal, and a series of subsequent bank select signals in response to subsequent, consecutive external controls signals; and a plurality of data latches, one said data latch being coupled to each said global I/O line.

2. The burst RAM of claim 1 wherein:

the number of local I/O lines within each corearray is an integer N;

the number of global I/O lines is M×N where M is an integer; and each particular bank select signal selects M tri-state driver banks.

3. The burst RAM of claim 1 wherein:

each global I/O line includes a global I/O line pair;

each column includes a bit line pair;

each local I/O line includes a local I/O line pair; and each tri-state driver bank includes a pair of tri-state drivers for each local I/O line pair.

4. The burst RAM of claim 1 wherein:

said address decoder includes a row decoder and a column decoder, and the address includes a row address and a column address.

5. The burst RAM of claim 4 wherein:

the row decoder receives the row address, and in response thereto, selects a corearray within each quadrant and a row within the selected corearray, the column decoder receives a first portion of the column address, and in response thereto, couples selected columns to their respective sense amplifiers within the selected corearray.

6. The burst RAM of claim 1 including:

buffer circuit for receiving the external control signal and generating an internal control signal therefrom; and said tri-state bank select sequencer includes address generating circuit for receiving a second portion of the address and the internal control signal, and providing a sequence of count bits in response thereto, the address generating circuit changing the count bits in response to each subsequent internal control signal to generate a burst sequence of count bits.

7. The burst RAM of claim 6 wherein:

said tri-state bank select sequencer includes decoder means for receiving the count bits and generating the initial and subsequent bank select signals therefrom.

8. The burst RAM of claim 1 wherein:

said plurality of global I/O lines includes a number of global I/O line groups; and each corearray includes two sets of local I/O lines, each set of local I/O lines being coupled to a different global I/O line group by the tri-state driver bank associated with the corearray.

9. A burst random access memory (RAM) for reading or writing data in a burst sequence having a burst length, the burst RAM including a plurality of arrays, each having memory cells arranged in rows and columns, the arrays further being arranged in half-quadrants, each half quadrant having sets of local input/output (I/O) lines for accessing the memory cells therein, comprising:

a plurality of data latches, the data latches being arranged in latch sets;

a set of global I/O lines coupled to each latch set;

an I/O group of half-quadrants associated with each set of global I/O lines, the number of half-quadrants in each I/O group being equal to at least the burst length;

a bank of tri-state drivers associated with each half-quadrant, the banks of tri-state drivers commonly coupling the sets of local I/O lines of half-quadrants within the same I/O group to the set of global I/O lines associated with the group;

a decoder for receiving an external address and activating at least one row within each different I/O group of half-quadrants, and coupling selected columns associated with the active row to a set of local I/O lines; and a sequencing circuit for receiving the least significant bits (LSBs) of the column address and generating a burst sequence of LSBs in response to an internal control signal, each LSB combination of the burst sequence enabling a bank of tri-state drivers associated with one half-quadrant within each I/O group.

10. The burst RAM of claim 9 wherein:

the half-quadrants are arranged in quadrants, each quadrant including two half-quadrants from different I/O groups.

11. The burst RAM of claim 10 wherein:

each of the tri-state driver banks in a quadrant is enabled by the same LSB combination.

12. The burst RAM of claim 10 wherein:

the number of I/O groups is four, and the quadrants are disposed in two, generally parallel quadrant columns disposed in a longitudinal direction, a first half of a first quadrant column including half-quadrant combinations of a first and a second I/O group, a first half of a second column including combinations of a second and a fourth I/O groups, a second half of the first column including combinations of the first and third I/O groups, and a second half of the second column including combinations of the third and fourth I/O groups.

13. The burst RAM of claim 12 wherein:

the sets of global I/O lines includes a first set, a second set, a third set, and a fourth set;

the sets of local I/O lines in the first I/O group shares the first set of global I/O lines, the second I/O group of half-quadrants shares the second set of global I/O lines, the second set being intermediate the first halves of the quadrant columns, the third I/O group shares the third set of global I/O lines, the third set being intermediate the second halves of the quadrant columns, and the fourth group of half-quadrants shares the fourth set of global I/O lines.

14. The burst RAM of claim 9 wherein:

said decoder includes a row decoder responsive to a row address for activating the one row within each different I/O group of half-quadrants, and a column decoder responsive to the most significant bits of a column address for coupling the selected columns associated with the active row to a set of local I/O lines.

15. A burst random access memory (RAM) having a plurality of corearrays with memory cells arranged in rows and columns, the memory cells of each corearray being accessed by a local input/output (I/O) lines, the RAM further including global I/O lines for providing a data path from the local I/O lines to I/O buffers, comprising:

a tri-state driver intermediate each local I/O line and the global I/O lines;

a decoder circuit for accessing memory locations for an entire burst sequence on local I/O lines according to a portion of an address; and a control circuit for selectively enabling tri-state drivers according to the burst sequence, such that a different set of local I/O lines drive the global I/O lines, via the tri-state drivers, during each count of the burst sequence.

16. The RAM of claim 15 wherein:

each global I/O line terminates in a latch.

17. The RAM of claim 16 wherein:

the tri-state drivers are proximate the corearrays; and the latches are generally remote from the corearrays.

18. The RAM of claim 15 wherein:

the corearrays are arranged in quadrants;

said decoder means activates at least one row within each quadrant according to the row address; and said control means commonly activates the tri-state driver associated with the local I/O lines of each quadrant.

19. The RAM of claim 15 including:

a passgate in parallel with each tri-state driver for providing a write path from the global I/O lines to their respective local I/O lines; and said decoder means includes a logic circuit for receiving a write enable signal and selectively enabling the passgates and disabling the tri-state drivers in response to an active write enable signal.

20. The RAM of claim 15 wherein:

said decoder means includes a row decoder and a column decoder, and the address includes a row address and the upper bits of a column address.

* * * * *